(12) United States Patent
Chen

(10) Patent No.: US 10,700,137 B2
(45) Date of Patent: Jun. 30, 2020

(54) DISPLAY PANEL AND DISPLAY DEVICE

(71) Applicant: Shanghai Tianma AM-OLED Co.,Ltd., Shanghai (CN)

(72) Inventor: Xian Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/137,308

(22) Filed: Sep. 20, 2018

(65) Prior Publication Data

US 2019/0206950 A1 Jul. 4, 2019

(30) Foreign Application Priority Data

Dec. 29, 2017 (CA) .......................... 2017 1 1480453

(51) Int. Cl.
*H01L 27/32* (2006.01)
*G02F 1/1335* (2006.01)
*H01L 51/00* (2006.01)
*G02F 1/1368* (2006.01)

(52) U.S. Cl.
CPC .... *H01L 27/3218* (2013.01); *G02F 1/133514* (2013.01); *G02F 1/1368* (2013.01); *G02F 2201/52* (2013.01); *G02F 2201/56* (2013.01); *H01L 51/0096* (2013.01)

(58) Field of Classification Search
CPC ............. H01L 27/3218; H01L 27/3248; H01L 27/3262; H01L 27/3276
See application file for complete search history.

(56) References Cited

U.S. PATENT DOCUMENTS

| 6,326,981 | B1 * | 12/2001 | Mori | ................ G02F 1/133514 345/694 |
| 2003/0218618 | A1 * | 11/2003 | Phan | .................... G09G 3/2074 345/629 |
| 2016/0013252 | A1 * | 1/2016 | Wang | .................. H01L 27/3213 345/206 |
| 2018/0088260 | A1 * | 3/2018 | Jin | .................... G02F 1/134309 |

FOREIGN PATENT DOCUMENTS

| CN | 102903318 A | 1/2013 |
| CN | 103698929 A | 4/2014 |
| CN | 106932985 A | 7/2017 |
| CN | 107086239 A | 8/2017 |

* cited by examiner

*Primary Examiner* — Trang Q Tran
(74) *Attorney, Agent, or Firm* — Alston & Bird LLP

(57) ABSTRACT

A display panel is provided. It has N types of sub-pixels, each type emits a different color of light, here N is a positive integer and N ≥ 3. The panel includes: a matrix of repetitive units arranged, each unit has N-row & N-column sub-pixels. The N sub-pixels in each row or each column emit light of different colors. For each repetitive unit, the N sub-pixels along one diagonal line emits light of the same color, and at least two of the N sub-pixels along another diagonal line emit light of different colors; two adjacent sub-pixels in the same column form one pixel unit, and have shapes which are mirror-symmetrical to each other.

17 Claims, 10 Drawing Sheets

DISPLAY PANEL AND DISPLAY DEVICE

CROSS-REFERENCE TO RELATED APPLICATIONS

The present application claims priority to Chinese Patent Application No. CN201711480453.9, filed on Dec. 29, 2017, the content of which is incorporated herein by reference in its entirety.

TECHNICAL FIELD

The present disclosure relates to the field of display technologies and, in particular, to a display panel and a display device.

BACKGROUND

With the development of science and technology, display devices are used more widely, and display devices have become necessities of general life. Thus, demands on the display quality from display devices have got higher.

For current display devices, color edges are prone to occur, especially at a display panel's edges. And the color edge problem is a technical problem which needs to be alleviated urgently in the industry.

SUMMARY

The present disclosure provides a display panel and a display device, configured to alleviate the color edge problem of the display panel and display device, thereby improving the display effect.

In a first aspect, the present disclosure provides a display panel having N types of sub-pixels having different light-emitting colors, wherein N is a positive integer and N ≥ 3, including: a plurality of repetitive units arranged in an array, wherein each repetitive unit of the plurality of repetitive units comprises N*N sub-pixels arranged in N rows and N columns of the N types of sub-pixels, and N sub-pixels in each row and/or in each column have different light-emitting colors. For each of the plurality of repetitive units, the N sub-pixels along one diagonal line of the repetitive unit have an identical light-emitting color, and at least two of N sub-pixels along the other diagonal line of the repetitive unit have different light-emitting colors. Two adjacent sub-pixels in a same column form one pixel unit, and the two adjacent sub-pixels in the pixel unit have shapes which are mirror-symmetrical to each other in a column direction.

In a second aspect, the present disclosure provides a display device including the above-mentioned display panel.

The beneficial effects of the above-mentioned aspects and any possible implementation are as follows: in one repetitive unit included by the display panel, N sub-pixels in a same row (and/or column) each have a different light-emitting color, i.e., the sub-pixels in a same row (and/or column) have N different light-emitting colors, so as to avoid the situation existing in the related art that the sub-pixels in a same row (and/or column) have only one light-emitting color, and thus alleviating the color edge phenomenon existing in the rows and/or columns at the edge of the display area, thereby improving the display effect.

BRIEF DESCRIPTION OF DRAWINGS

The accompanying drawings are briefly introduced as follows. The drawings are not meant to be limiting; those skilled in the art will be able to see alternative drawings without paying creative effort.

DESCRIPTION OF EMBODIMENTS

In order to make the purpose, technical solutions, and advantages of the embodiments of the present disclosure to be clearer, the technical solutions in the embodiments of the present disclosure are clearly and completely described in the following with reference to the accompanying drawings. Obviously, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that, the term "and/or" as used herein merely means an association relationship that describes relation of associated objects, which means that there may be three relationships. For example, "A and/or B" may represent three cases: only "A" is presented, both "A and B" are presented, and only "B" is presented. In addition, the symbol "/" as used herein generally means an "or" relation of the associated objects.

It should be understood that, although some elements may be described using the terms of "first", "second", "third", "fourth", etc., in the embodiments of the present disclosure, the ordering of such elements will not be limited to these terms. These terms are merely used to distinguish elements from one another. For example, without departing from the scope of the embodiments of the present disclosure, a first "element" may also be referred to as a second "element", similarly, a second "element" may also be referred to as a first "element", a third "element" may also be referred to as a fourth "element", or the like.

It should be noted that, the expressions such as "upper", "lower", "left", "right" and the like mentioned in embodiments of the present disclosure are described with reference to the location status in the accompanying drawings, and should not be construed as limiting embodiments of the present disclosure. In addition, it should also be understood that, in the context, while referring to an element being formed "above" or "below" another element, it is possible that the element is directly formed "above" or "below" the other element, it is also possible that the element is formed "above" or "below" the other element via an intermediate element.

Figure 1:
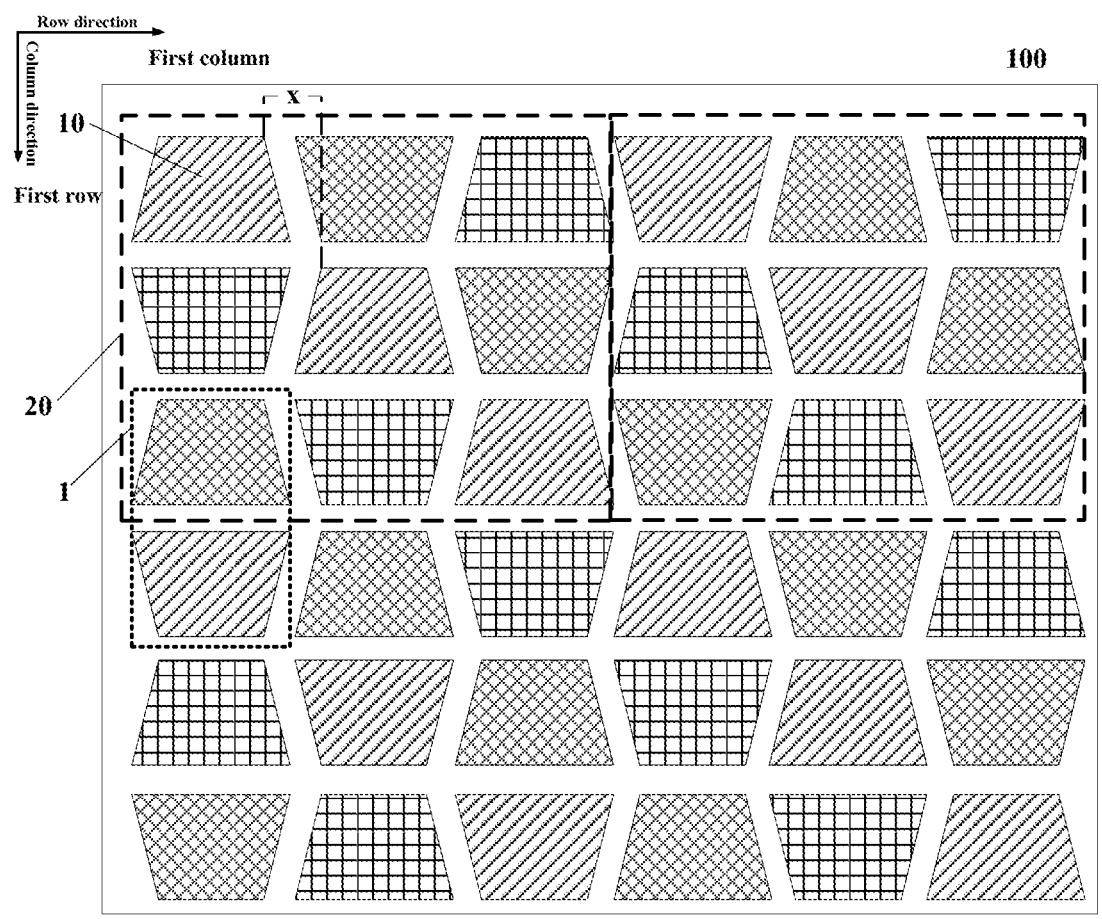
FIG. 1 is a structural schematic diagram of a display panel provided by an embodiment of the present disclosure.

The present disclosure provides a display panel, as shown in FIG. 1, which is a structural schematic diagram of a display panel provided by an embodiment of the present disclosure. The display panel 100 includes N types of sub-pixels 10 having different light-emitting colors, wherein N is a positive integer and N ⩾ 3. FIG. 1 exemplarily shows three types of sub-pixels 10 having different light-emitting colors, and three different filling patterns are used in FIG. 1 to represent three different light colors. The display panel 100 further includes multiple repetitive units 20 arranged in an array. The multiple repetitive units 20 each include N-row & N-column of sub-pixels 10. For each of the multiple repetitive units 20, the N sub-pixels in each row are different from one another, and/or the N sub-pixels in each column are different from one another. For each of the multiple repetitive units 20, the N sub-pixels arranged in one diagonal line have the same light-emitting color, and at least two of the N sub-pixels arranged in the other diagonal line have different light-emitting colors. Two adjacent sub-pixels 10 in the same column form one pixel unit 1, and the shapes of the two sub-pixels 10 in the pixel unit 1 are mirror-symmetrical to each other in a column direction.

It should be understood that, in an embodiment, the shapes of any two adjacent sub-pixels 10 in a same column are mirror-symmetrical to each other in the column direction, and the two adjacent sub-pixels 10 form a pixel unit 1. The above expressions may have the following two interpretations.

Interpretation One: as shown in FIG. 1, the shapes of the two sub-pixels 10 in any one pixel unit 1 are mirror-symmetrical to each other in the column direction.

Interpretation Two: in the column direction, the shapes of two adjacent sub-pixels 10 in two adjacent pixel units 1 are mirror-symmetrical to each other in the column direction.

Figure 2:
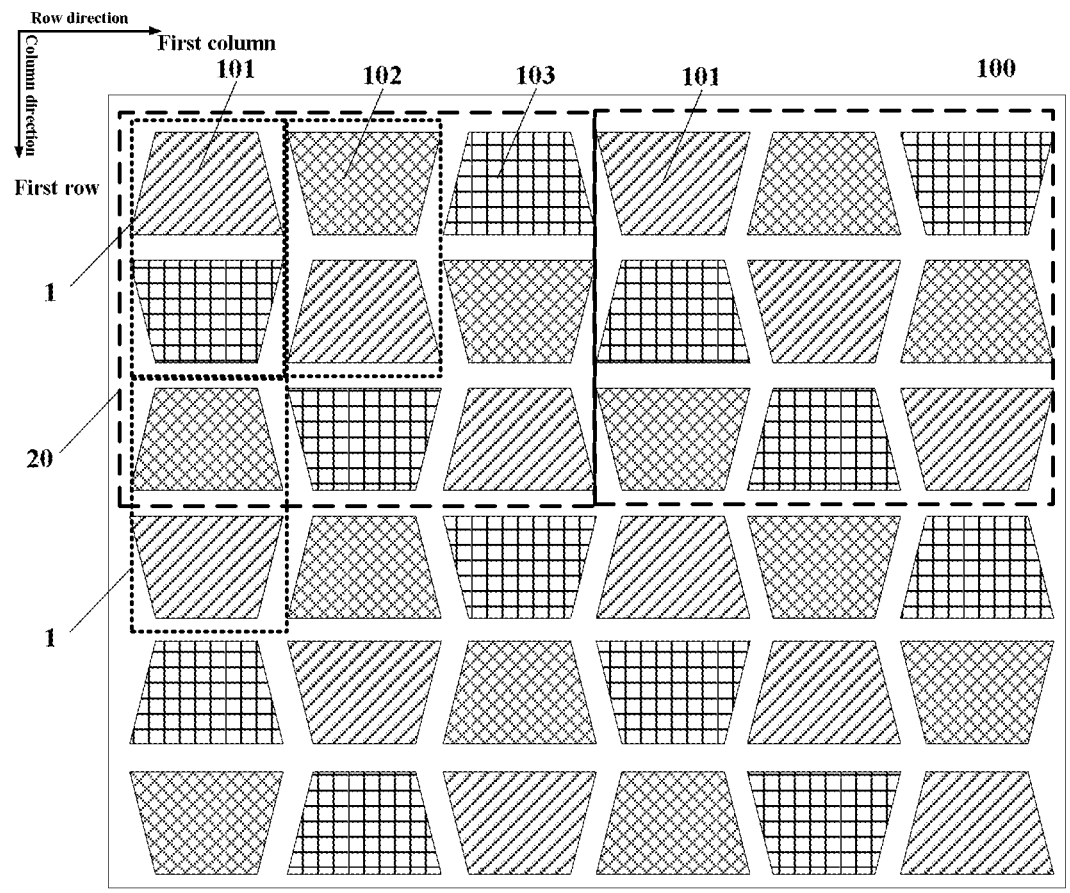
FIG. 2 is another structural schematic diagram of a display panel provided by an embodiment of the present disclosure.

FIG. 2 is another display panel provided by an embodiment of the present disclosure. The repetitive unit 20 includes three types of sub-pixels emitting light of different light-emitting colors: sub-pixel 101, sub-pixel 102 and sub-pixel 103. Exemplarily, sub-pixel 101 may emit red, sub-pixel 102 may emit green, and the sub-pixel 103 may emit blue. The shape of a blue sub-pixel 103 in a pixel unit located at an upper position of the first column and the shape of the green sub-pixel 102 in its adjacent pixel unit (a pixel unit located at a lower position) are mirror-symmetrical to each other in the column direction.

It should be noted that, as an example, three (N=3) types of light-emitting sub-pixels are shown in FIG. 1 and FIG. 2. However, N may also be 4, 5 or 6 or other number, as long as N is a positive integer and N ⩾ 3. In addition, in the embodiments, N represents a specific numerical value. Therefore, the display panel may include N types of sub-pixels having different light-emitting colors, meanwhile the repetitive unit may also include N-row & N-column of sub-pixels. That is, no matter how many types of sub-pixels having different light-emitting colors are provided, the repetitive unit may include a same number of rows and/or columns as the number of the types of sub-pixels having different light-emitting colors. Exemplarily, as shown in FIG. 1, N=3, indicates that the display panel includes three types of sub-pixels having different light-emitting colors, meanwhile the repetitive unit includes 3-row & 3-column of sub-pixels. It should be understood that, the shapes of the sub-pixels in mirror symmetry are not limited to isosceles trapezoid shown in FIG. 1 and FIG. 2. The shapes of the sub-pixels are not limited herein, as long as the requirement of the mirror symmetry is satisfied.

In the related art, the sub-pixels having different light-emitting colors disposed in the display area are sequentially arranged in a row direction, and thus the sub-pixels in a same column include only one light-emitting color, resulting in that a color edge appears during edge displaying. Taking the red (R), the green (G) and the blue (B) as an example, in the prior art, the RGB are sequentially arranged in the row direction, in this case, the sub-pixels in a same column include only one of the R, C and B. Therefore, during displaying, it appears that one color of R, G and B is brighter than the other two thereof, resulting in the color edge. Since there is no other sub-pixel having a different light-emitting color at the edge of the display panel, the color edge phenomenon may be intensified, which may deteriorate the display effect.

In an embodiment, in one repetitive unit 20, N sub-pixels in a same row (and/or column) each have a different light-emitting color, i.e., there are N sub-pixels in a same row (and/or column) having N different light-emitting colors, so as to avoid the situation existing in the related art that there are sub-pixels in a same row (and/or column) having only one light-emitting color, and thus alleviating the color edge phenomenon existing in the rows and/or columns at the edge of the display area, thereby improving the display effect.

With further reference to FIG. 1, a minimum evaporation interval between two sub-pixels having a same light-emitting color is x, which has a larger movable evaporation distance than that of the conventional rectangular sub-pixel in the related art, which is beneficial to the evaporation. In the related art, the aperture area of the sub-pixel has to be decreased if the same evaporation interval x is achieved. The technical solution provided by the embodiments can make a balance between the aperture area and the evaporation interval x, and improve the aperture area of the sub-pixel while keeping a certain evaporation interval.

In addition, it should be understood that, as for two mutually mirror-symmetrical sub-pixels having different light-emitting colors, a position for the color mixing is a position of the symmetry axis when the color mixing is performed, so that the chroma obtained by mixing the two becomes full and a color cast does not appear.

In an embodiment, as shown in FIG. 2, in the repetitive unit 20, at least two of the N sub-pixels 10 in a same row (and/or column) have different shapes. Since the two sub-pixels included in the pixel unit 1 are mirror-symmetrical to each other in the column direction, the shapes of the two sub-pixels are certainly different. Therefore, in the repetitive unit 20, at least two of the N sub-pixels 10 in a same row (and/or column) have different shapes.

In an embodiment, the shape of a sub-pixel 10 at an arbitrary position in any one repetitive unit 20 is a mirror-symmetrical shape of a sub-pixel 10 at the same position in a repetitive unit 20 adjacent to any one repetitive unit 20 in row and/or column direction. With further reference to FIG. 2, in the first row, the shape of the red sub-pixel 101 in a left repetitive unit is mirror-symmetrical to the shape of the red sub-pixel 101 at the same position in an adjacent right repetitive unit. That is, the shape of the red sub-pixel 101 in the right repetitive unit is the same as a shape which is mirror-symmetrical in the column direction to the shape of the red sub-pixel 101 in the left repetitive unit.

In an embodiment, in the row direction, the shapes of two adjacent sub-pixels 10 in two adjacent pixel units 1 are point-symmetrical to each other. Exemplarily, with further reference to FIG. 2, the shape of the red sub-pixel 101 in the first row and the shape of the green sub-pixel 102 in the first row are point-symmetrical to each other. Assuming that the to-be-displayed light is yellow light, i.e., mixture of the red sub-pixel 101 and the green sub-pixel, when the two are point-symmetrical to each other, the position for color mixing is a point-symmetric position, so that the yellow color obtained by mixing the two has uniform brightness and full chroma.

With reference to the above-mentioned embodiment of FIG. 1, the shapes of the sub-pixels along each diagonal line of the repetitive unit 20 are the same. It should be understood that, as for the repetitive unit 20 including N-row & N-column of sub-pixels, if N is an even number, the sub-pixels along two diagonal lines of the repetitive unit 20 may have different shapes, and the sub-pixels along each one diagonal line of the repetitive unit 20 have the same shape.

Figure 3:
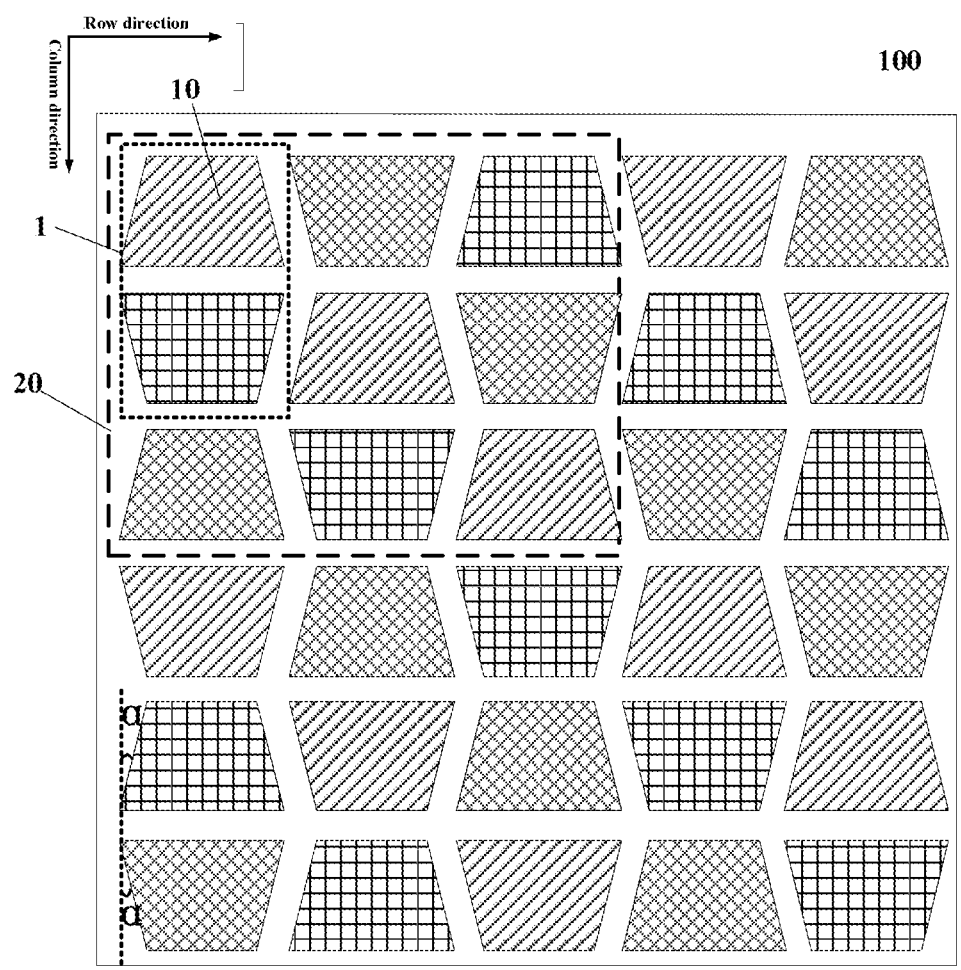
FIG. 3 is another structural schematic diagram of a display panel provided by an embodiment of the present disclosure.

In an embodiment shown in FIG. 3, FIG. 3 is another structural schematic diagram of a display panel provided by an embodiment of the present disclosure. An angle α is formed between at least one side of an arbitrary sub-pixel 10 and the column direction, wherein 0°<α<90°. It should be understood that, one side of the sub-pixel 10 may not be parallel to the column direction.

Figure 4:
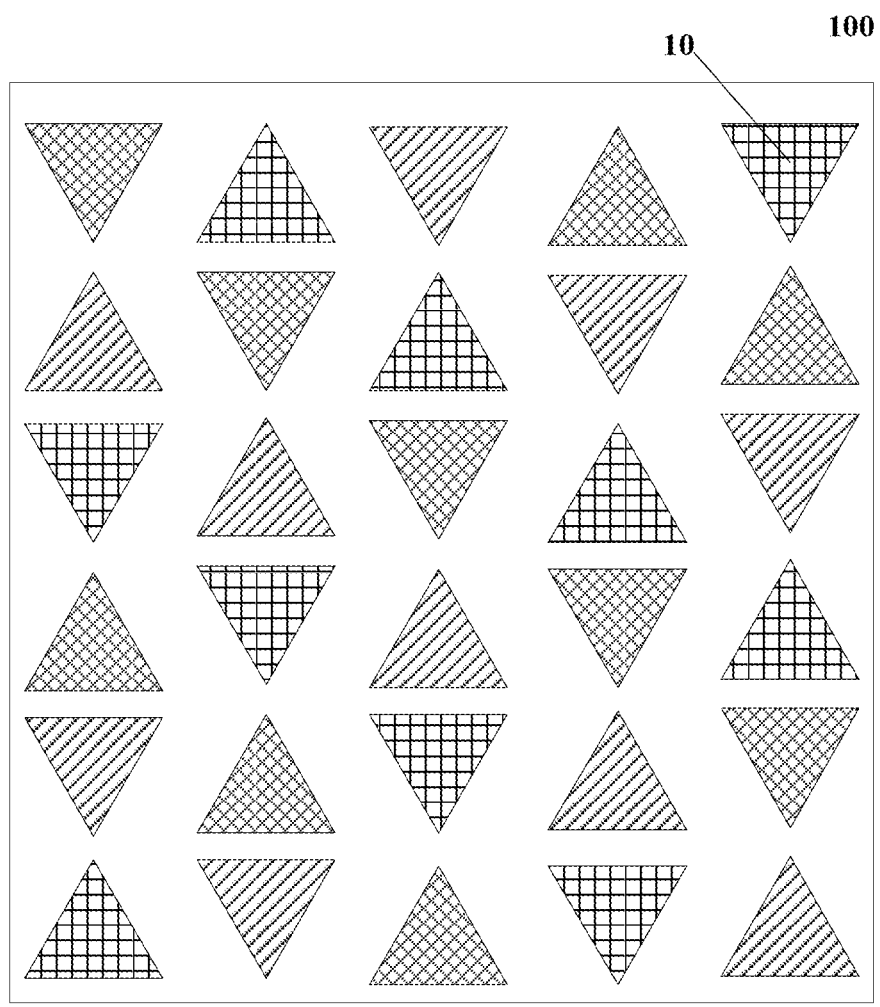
FIG. 4 is another structural schematic diagram of a display panel provided by an embodiment of the present disclosure.
Figure 5:
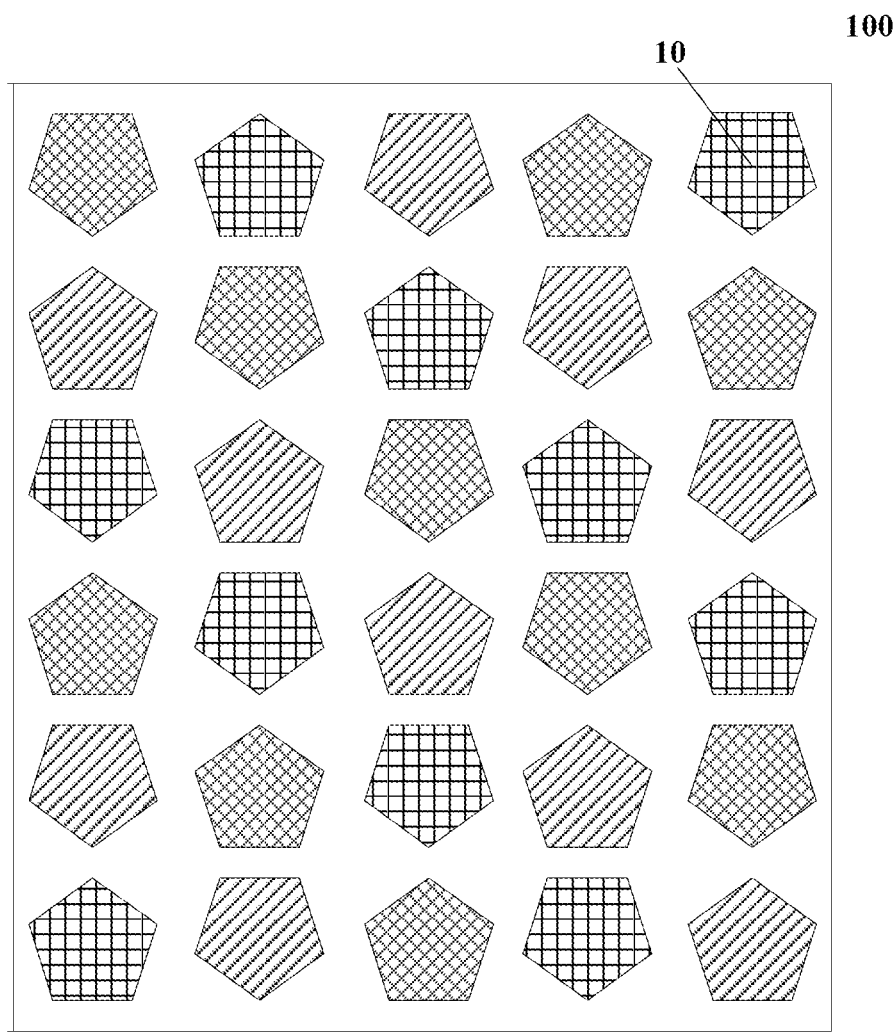
FIG. 5 is another structural schematic diagram of a display panel provided by an embodiment of the present disclosure.
Figure 6:
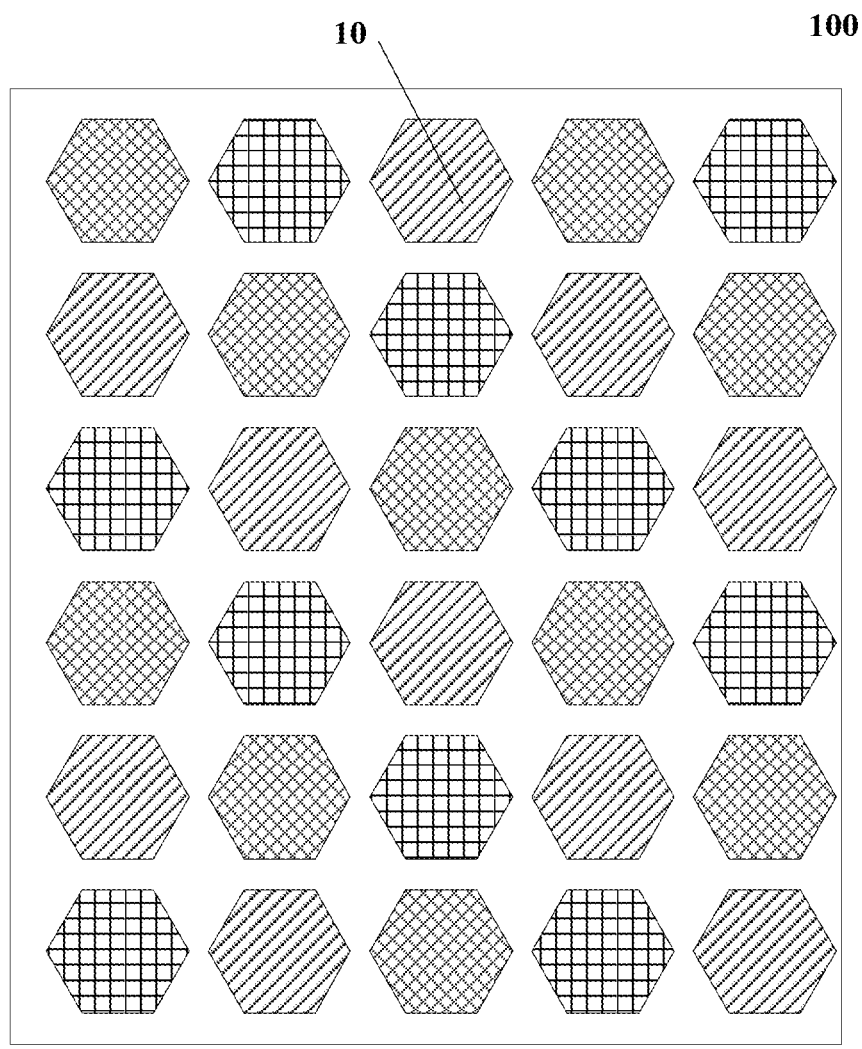
FIG. 6 is another structural schematic diagram of a display panel provided by an embodiment of the present disclosure.

Further, the sub-pixel 10 in the embodiments may have a variety of shapes. In an embodiment, as shown in FIG. 4, FIG. 4 is another structural schematic diagram of a display panel provided by an embodiment of the present disclosure, and the sub-pixel 10 is triangle-shaped. In an embodiment, as shown in FIG. 3, the sub-pixel 10 is quadrangle-shaped. In an embodiment, as shown in FIG. 5, FIG. 5 is another structural schematic diagram of a display panel provided by an embodiment of the present disclosure, and the sub-pixel 10 is pentagon-shaped. In an embodiment, as shown in FIG. 6, FIG. 6 is another structural schematic diagram of a display panel provided by an embodiment of the present disclosure, and the sub-pixel 10 is hexagon-shaped.

With reference to FIG. 3, when the sub-pixel in this embodiment is quadrangle-shaped, the shape of the sub-pixel in this embodiment may be an isosceles trapezoid. Compared with the rectangular sub-pixels, an interval between the isosceles trapezoidal sub-pixels 10 having a same light-emitting color is larger there between, which is beneficial to the evaporation. As for the rectangular sub-pixels, the aperture area of the sub-pixel is relatively small when the same evaporation interval is achieved. The technical solution provided by the embodiments can make a balance between the aperture area and the evaporation interval x, and improve the aperture area of the sub-pixel while keeping a certain evaporation interval.

Figure 7:
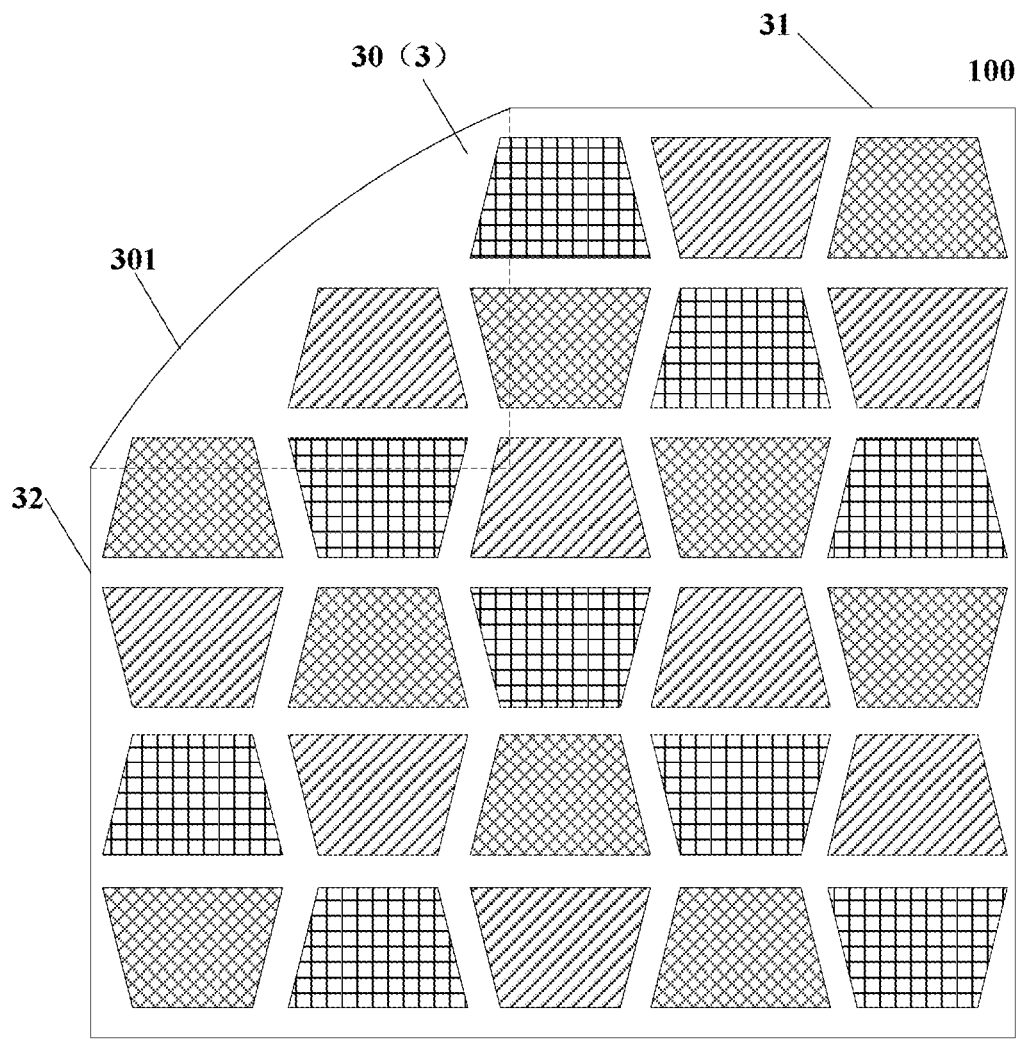
FIG. 7 is another structural schematic diagram of a display panel provided by an embodiment of the present disclosure.

In an embodiment, as shown in FIG. 7, FIG. 7 is another structural schematic diagram of a display panel provided by an embodiment of the present disclosure. The display panel 100 includes a display area 3. The display area 3 includes at least one irregular-shaped display area 30. The irregular-shaped display area 30 is disposed at an edge of the display area 3. The irregular-shaped display area 30 includes at least one irregular-shaped side 301. The display area 3 has a first side 31 and a second side 32, and the first side 31 is connected to the second side 32 via the irregular-shaped side 301. Since the irregular-shaped side 301 is one side of the display area 3, the irregular-shaped display area 30 including the irregular-shaped side 301 is inevitably arranged at the edge of the irregular-shaped display area 3.

Further, with reference to FIG. 7, in an embodiment, irregular-shaped side 301 may be an edge or corner of the display panel. A smooth curve does not scratch the wiring disposed thereon. In addition, compared with a sharp corner, a smooth line is more beneficial to the encapsulation and avoids the encapsulation adhesive from being pierced. In another embodiment, as shown in FIG. 8, which is another structural schematic diagram of a display panel provided by an embodiment of the present disclosure, the shape of the irregular-shaped side 301 may be a straight line.

Figure 8:
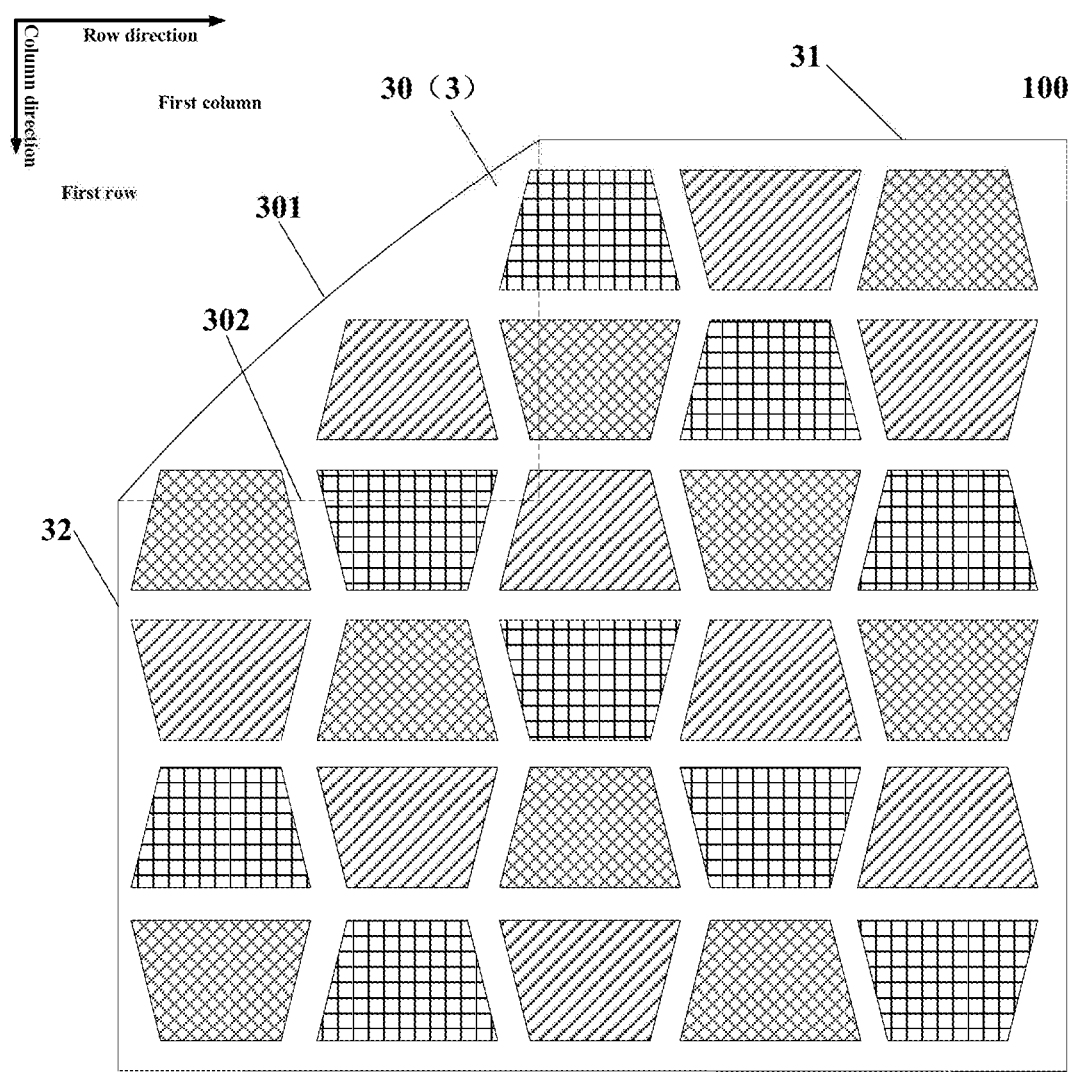
FIG. 8 is another structural schematic diagram of a display panel provided by an embodiment of the present disclosure.

With the embodiments shown in FIG. 7 and FIG. 8 in combination with the embodiment shown in FIG. 3, it can be known that, one side of the sub-pixel 10 forms a certain angle α with respect to the column direction. Since an extending direction of the irregular-shaped side 301 also forms a certain angle with respect to the column direction, when the sub-pixel 10 forming an angle with respect to the column direction is adjacent to the irregular-shaped side 301, a width between the irregular-shaped side 301 and this sub-pixel 10 can be decreased, thereby reducing the formation of sawtooth between adjacent rows, and thus improving the display effect at the position of the irregular-shaped side 301. Further, when an angle between an extending line of the irregular-shaped side 301 and the column direction is equal to α, the saw tooth may be eliminated, thereby further improving the display effect.

It should be noted that, as shown in FIG. 7 and FIG. 8, the irregular-shaped area 30 is an area which is provided artificially. In fact, the sub-pixel 10 in the display panel 100 is not cut apart, that is, a boundary 302 of the irregular-shaped display area is a dummy boundary and does not physically exist in the entire display panel, so as not to cut apart the sub-pixels that are disposed across the irregular-shaped display area and other display areas.

In an embodiment, with further reference to FIG. 8, light-emitting colors of any two adjacent sub-pixels 10 in a column direction and/or a row direction nearby the irregular-shaped side 301 are different from one another. Exemplarily, in the first column as shown in FIG. 8, light-emitting colors of any two adjacent sub-pixels 10 are different, that is, more than one light-emitting color exists in this column, so that the color edge can be effectively alleviated during displaying. Further, the display panel in this embodiment includes sub-pixels having N different light-emitting colors, and each row and/or column includes sub-pixels having N different light-emitting colors, so as to avoid the appearance of the color edge, thereby further improving the display effect.

In an embodiment, the display panel 100 includes sub-pixels having three different light-emitting colors; and the repetitive unit includes 3-row & 3-column of sub-pixels. That is, N=3. Further, the three light-emitting colors are red, green and blue, respectively.

In combination with the embodiment shown in FIG. 1, the display of the pixel unit will be described in the embodiment.

Figure 9:
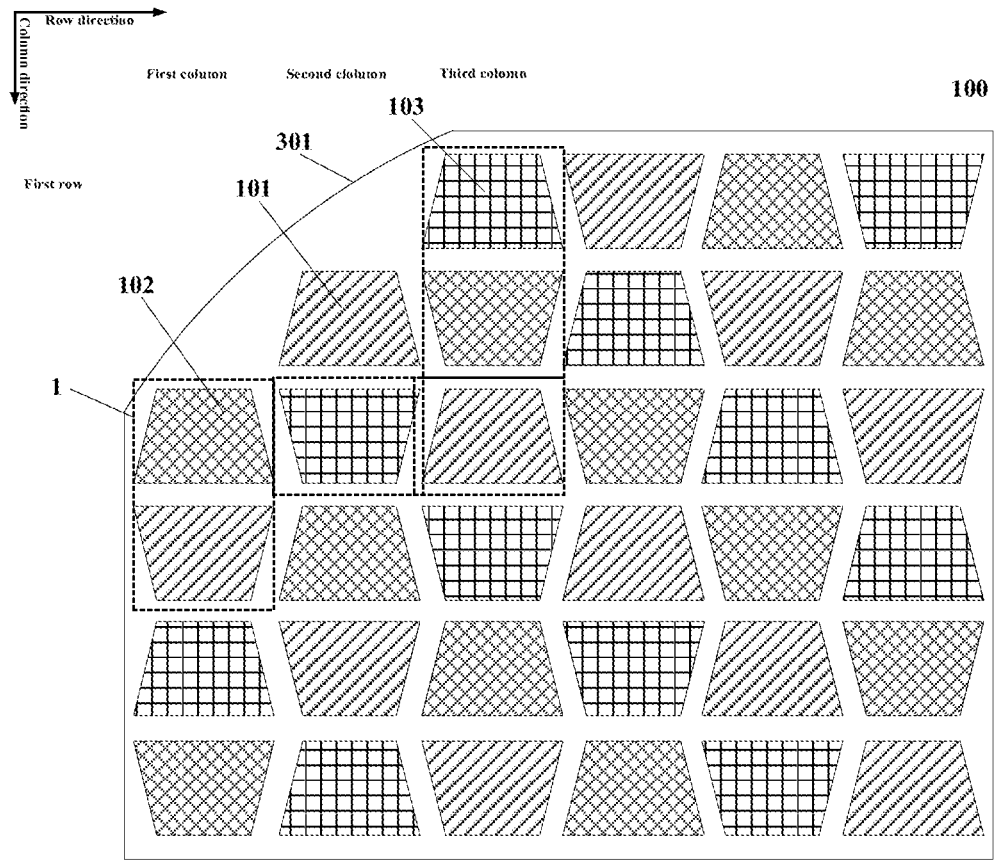
FIG. 9 is another structural schematic diagram of a display panel provided by an embodiment of the present disclosure.

As shown in FIG. 9, FIG. 9 is another structural schematic diagram of a display panel provided by an embodiment of the present disclosure. In this embodiment, the sub-pixels having two different light-emitting colors in a pixel unit 1 and the sub-pixel emits a third color in another pixel unit 1 adjacent to the previous pixel unit 1 in the row direction or the column direction constitute a display unit; and the light displayed by a same display unit is white light.

The above-described embodiment may have the following two interpretations.

Interpretation One: a green sub-pixel 102 and a red sub-pixel 101 in a first row form a pixel unit 1. When white light is displayed, this pixel unit borrows a blue sub-pixel 103 from its adjacent pixel unit in the row direction (an adjacent pixel unit in the second column) so as to form a display unit, so that the white light can be normally displayed.

Interpretation Two: a blue sub-pixel 103 and a green sub-pixel 102 in a third column form a pixel unit 1, and this pixel unit borrows a red sub-pixel 101 from its adjacent pixel unit in the column direction so as to form a display unit for displaying white light. In combination with this embodiment and the above-mentioned embodiments, it can be known that two sub-pixels in a pixel unit are mirror-symmetrical to each other in the column direction. In addition, two adjacent sub-pixels in adjacent pixel units are mirror-symmetrical to each other in the column direction. It is further understood that, in the adjacent three sub-pixels in the column direction, two sub-pixels on both sides have a same shape. For example, in the third column, the shape of the blue sub-pixel 103 is the same as the shape of a third sub-pixel (the red sub-pixel 101). Therefore, when white light is displayed, a light-emitting center of the sub-pixels having three different light-emitting colors is at a position of the second sub-pixel (the green sub-pixel 102), so that the color mixture is uniform and the resulting white light is full of chroma.

In this embodiment, the pixel unit itself is constituted by two sub-pixels. Compared with the conventional pixel unit formed by three sub-pixels, the present embodiment can provide more pixel units in a specific display panel so as to effectively improve the resolution of the display panel. Therefore, in this embodiment, a shared sub-pixel is adopted so as to improve the resolution of the display panel without deteriorating normal display of the display panel.

Due to the area limitation from the irregular-shaped side, the aperture area of at least one of the three sub-pixels have different light-emitting color ratios the conventional pixel unit may include only two sub-pixels with different light-emitting colors, and thus deteriorating the display or even resulting in a failure of normal displays.

In this embodiment, the pixel units can be provided at a position of the irregular-shaped side and do not deteriorate the normal display of the irregular-shaped side because of the following reasons.

A sub-pixel close to the irregular-shaped side 301 and another sub-pixel adjacent to the previous sub-pixel in the same column form a pixel unit. The pixel unit can borrow a sub-pixel having a third light-emitting color from another pixel unit in the same column or in the same row when white light is displayed, so that white light can be displayed normally, and the display effect is not deteriorated.

Figure 10:
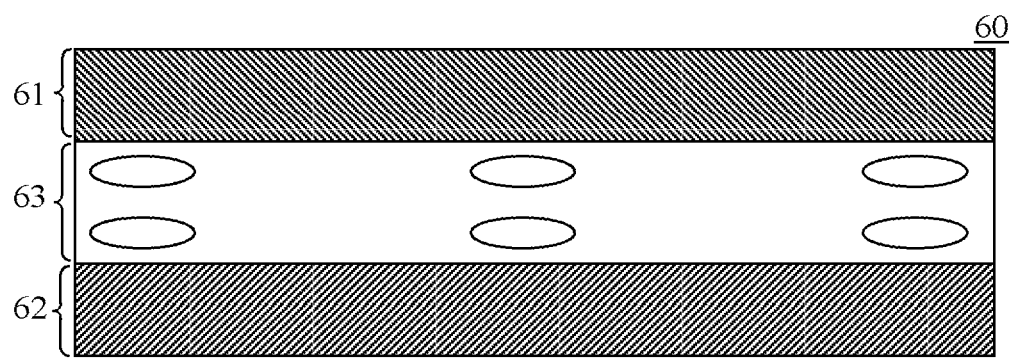
FIG. 10 is side view of a display panel provided by an embodiment of the present disclosure.

As shown in FIG. 10, FIG. 10 is another side view of a display device provided by an embodiment of the present disclosure. In this embodiment, the display panel is a liquid crystal panel 60. The liquid crystal display panel 60 includes an array substrate 62, a color filter substrate 61 opposed to the array substrate 62, and a liquid crystal layer 63 disposed between the array substrate 62 and the color filter substrate 61.

The display principle of the liquid crystal display panel will be briefly described in the following.

The array substrate 62 is provided with a plurality of sub-pixels (not shown) crossed and defined by a plurality of rows of gate lines (not shown) and a plurality of columns of data lines (not shown). Each sub-pixel is provided with a thin film transistor (not shown), a pixel electrode (not shown), and a common electrode (not shown). Each thin film transistor has a gate electrode connected to a gate line, and a source electrode connected to a data line, and a drain electrode connected to a pixel electrode. Under the control of the corresponding gate line, the data line corresponding to the source electrode of the thin film transistor performs charging/discharging with respect to the pixel electrode corresponding to the drain electrode through the thin film transistor. An electric field is formed between the pixel electrode and the common electrode. When the liquid crystal display panel performs displaying, i.e., during a display stage, the common electrode receives a common voltage signal (usually a constant voltage signal), an electric field is formed between the pixel electrode and the common electrode so as to control rotation of the liquid crystal molecules in the liquid crystal layer, thereby achieving the display function.

Figure 11:
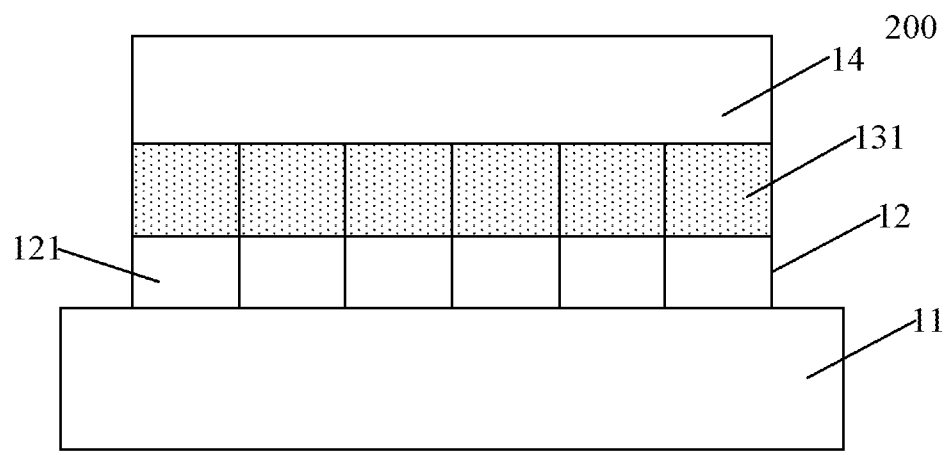
FIG. 11 is side view of a display panel provided by an embodiment of the present disclosure.

As shown in FIG. 11, FIG. 11 is diagram side view of a display panel provided by an embodiment of the present disclosure. In an embodiment, the display panel 100 may be an organic light-emitting display panel 200. The organic light-emitting display panel 200 includes a first substrate 11, and an anode layer 12 disposed on a side surface of the first substrate 11. The anode layer 12 including a plurality of anode blocks 121. The organic light-emitting display panel 200 further includes a plurality of light-emitting devices 131 disposed on a side surface of the anode layer 12 facing away from the first substrate 11. The plurality of light-emitting devices 131 each and the plurality of anode blocks 121 each are arranged in a one-to-one correspondent manner. The light-emitting device 131 includes in types of various color emitters, m is an integer greater than or equal to 3. The organic light-emitting display panel 200 further includes a cathode layer 14 disposed on a side surface of the plurality of light-emitting devices 131 facing away from the first substrate 11.

In an embodiment, the first substrate 11 may be a flexible substrate. Correspondingly, the organic light-emitting display panel 200 may be a flexible organic light-emitting display panel. The flexible organic light-emitting display panel has the advantages of low power consumption and bendability, and is suitable for various display devices, especially for wearable display devices. Optionally, the material of the flexible substrate is polyester imide or polyethylene terephthalate resin. In addition, it is also possible that the first substrate 11 is a rigid substrate, correspondingly, the organic light-emitting display panel is a rigid organic light-emitting display panel. In fact, the embodiments do not particularly limit the material of the organic light-emitting display panel.

In an embodiment, a positive voltage may be applied to the anode block 121 during electroluminescence. In an embodiment, the material of the anode block 121 may be indium tin oxide. The anode block 121 includes at least a reflective film disposed on the first substrate 11, and the material of the reflective film may be silver. The anode block 121 further includes a transparent conductive film disposed on a side surface of the reflective film facing away from the first substrate 22, and the material of the transparent conductive film may be indium tin oxide or indium zinc oxide.

In an embodiment, the cathode layer 14 is located on a side surface of the light-emitting device 131 facing away from the anode layer 12. In an embodiment, the cathode layer 14 is a cathode of the organic light-emitting display panel, and can apply a negative voltage to the cathode layer 14 during electroluminescence. The material of the cathode layer 14 may be a low work function metal material, such as Ag, Al, Ca, In, Li, Mg, etc. In an embodiment, the material of the cathode layer 14 may be one of magnesium silver alloy, silver alloy, silver ytterbium alloy, and silver rare earth metal alloy.

It should be understood that, in an embodiment, the plurality of light-emitting devices 131 is disposed between the anode layer 12 and the cathode layer 14. The plurality of light-emitting devices 131 and the plurality of anode blocks 121 are arranged in a one-to-one correspondent manner. Each of the plurality of light-emitting devices 131 can be understood as a sub-pixel. The light-emission principle is that, for any one of the plurality of light-emitting devices 131, a positive voltage is applied to the corresponding anode block 121 and a negative voltage is applied to the corresponding cathode layer 14. Holes generated by the anode 131 used as an anode are injected into the corresponding light-emitting device 131, electrons generated by the cathode layer 14 used as a cathode are injected into the corresponding light-emitting device 131, and excitons are generated by recombination of the electrons and the holes, and exciton radiation transition causes the organic light-emitting display panel to emit light.

Figure 12:
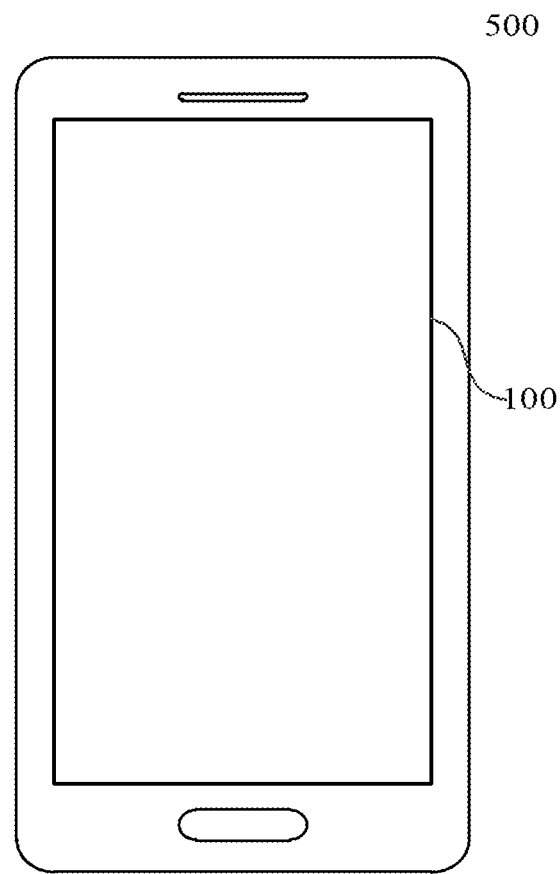
FIG. 12 is a top view of a display device having display panels provided by the embodiments above.

The present disclosure provides a display device, as shown in FIG. 12, which is a structural schematic diagram of a display device provided by an embodiment of the present disclosure. The display device 500 includes the display panel 1 described in the embodiments. It should be noted that, FIG. 12 takes a cellphone as an example of the display device, however, the display device is not limited to a cellphone. The display device may include but is not limited to any electrical device having a display function, such as a personal computer (PC), a personal digital assistant (PDA), a wireless handheld device, a tablet computer, an mp4 player, a television and the like.

Since the display device in the embodiments includes all technical features of the above-described display panel 1, the display device can achieve the functions that the display panel 1 can achieve, and has the beneficial advantages of the display panel 1.

Finally, it should be noted that, the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel having N types of sub-pixels having different light-emitting colors, wherein N is a positive integer and N≥3, wherein the display panel comprises:
a plurality of repetitive units arranged in an array, wherein each repetitive unit of the plurality of repetitive units comprises N*N sub-pixels arranged in N rows and N columns of the N types of sub-pixels,
wherein any two sub-pixels of N sub-pixels in each row and/or in each column of the repetitive unit have different light-emitting colors, N sub-pixels along one diagonal line of the repetitive unit have an identical light-emitting color, sub-pixels of the repetitive unit except the N sub-pixels along the diagonal line have different light-emitting colors from the N sub-pixels along the diagonal line, and at least two of N sub-pixels along another diagonal line of the repetitive unit have different light-emitting colors;
wherein two adjacent sub-pixels in a same column form one pixel unit, and the two adjacent sub-pixels in the pixel unit are mirror-symmetrical to each other in shape in a column direction; and
wherein any two adjacent sub-pixels in each row of a repetitive unit have different shapes, any two adjacent sub-pixels in each column of the repetitive unit have different shapes, and sub-pixels along each diagonal line of the repetitive unit have same shapes.

2. The display panel according to claim 1, wherein a shape of a sub-pixel at an arbitrary position in any repetitive unit of the plurality of repetitive units is mirror-symmetrical to a shape of another sub-pixel at the same position as said sub-pixel in an adjacent repetitive unit to said repetitive unit in a row direction and/or in the column direction.

3. The display panel according to claim 1, wherein two adjacent sub-pixels in any two adjacent pixel units are point-symmetrical to each other in shape in a row direction.

4. The display panel according to claim 1, wherein two adjacent sub-pixels in any two adjacent pixel units are mirror-symmetrical to each other in shape in the column direction.

5. The display panel according to claim 1, wherein an angle α is formed between at least one side of each sub-pixel of the N types of sub-pixels and the column direction, wherein 0°<α<90°.

6. The display panel according to claim 5, wherein a shape of each sub-pixel of the N types of sub-pixels is any one of a triangle, a quadrangle, a pentagon, and a hexagon.

7. The display panel according to claim 6, wherein each sub-pixel of the N types of sub-pixels is isosceles trapezoid shaped.

8. The display panel according to claim 1, wherein the display panel has a display area, comprising at least one irregular-shaped display area arranged at an edge of the display area; the irregular-shaped display area comprises at least one irregular-shaped side, the display area comprises a first side and a second side, the first side of the display area is connected to the second side of the display area by the irregular-shaped side; any adjacent two sub-pixels in the column direction or a row direction close to the irregular-shaped side have different light-emitting colors.

9. The display panel according to claim 8, wherein the irregular-shaped side is an arc or a straight line.

10. The display panel of claim 1, wherein N is 3, the display panel has 3 types of sub-pixels having different light-emitting colors, and each of the plurality of repetitive units comprises 3*3 sub-pixels arranged in 3 rows and 3 columns of the 3 types of sub-pixels.

11. The display panel according to claim 10, wherein the two sub-pixels having two different light-emitting colors in one pixel unit and another sub-pixel having a third light-emitting color different from the two different light-emitting colors in one adjacent pixel unit to said pixel unit in a row direction or the column direction form a display unit; and a same display unit displays white light.

12. The display panel according to claim 11, wherein the third light-emitting color is one of red, green and blue, and the two different light-emitting colors are the remaining two of red, green and blue.

13. The display panel according to claim 1, wherein the display panel is a liquid crystal display panel.

14. The display panel according to claim 1, wherein the display panel is an organic light-emitting display panel.

15. A display device comprising a display panel having N types of sub-pixels having different light-emitting colors, wherein N is a positive integer and N≥3, wherein the display panel comprises:
- a plurality of repetitive units arranged in an array, wherein each repetitive unit of the plurality of repetitive units comprises N*N sub-pixels arranged in N rows and N columns of the N types of sub-pixels,
- wherein any two sub-pixels of N sub-pixels in each row and/or in each column of the repetitive unit have different light-emitting colors, N sub-pixels along one diagonal line of the repetitive unit have an identical light-emitting color, sub-pixels of the repetitive unit except the N sub-pixels along the diagonal line have different light-emitting colors from the N sub-pixels along the diagonal line, and at least two of N sub-pixels along another diagonal line of the repetitive unit have different light-emitting colors;
- wherein two adjacent sub-pixels in a same column form one pixel unit, wherein the two adjacent sub-pixels in the one pixel unit are mirror-symmetrical to each other in shape in a column direction;
- wherein any two adjacent sub-pixels in each row of a repetitive unit have different shapes, wherein any two adjacent sub-pixels in each column of the repetitive unit have different shapes, and sub-pixels along each diagonal line of the repetitive unit have same shapes.

16. The display panel according to claim 5, wherein a shape of each sub-pixel of the N types of sub-pixels is a quadrangle.

17. A display panel having N types of sub-pixels having different light-emitting colors, wherein N is a positive integer and N>3, wherein the display panel comprises:
- a plurality of repetitive units arranged in an array, wherein each repetitive unit of the plurality of repetitive units comprises N*N sub-pixels arranged in N rows and N columns of the N types of sub-pixels,
- wherein any two sub-pixels of N sub-pixels in each row and/or in each column of the repetitive unit have different light-emitting colors, N of the sub-pixels along one diagonal line of the repetitive unit have an identical light-emitting color, and at least two of N sub-pixels along another diagonal line of the repetitive unit have different light-emitting colors;
- wherein two adjacent sub-pixels in a same column form one pixel unit, wherein the two adjacent sub-pixels in the pixel unit are mirror-symmetrical to each other in shape in a column direction,
- wherein the display panel has a display area, comprising at least one irregular-shaped display area arranged at an edge of the display area; wherein the irregular-shaped display area comprises at least one irregular-shaped side, wherein the display area comprises a first side and a second side, wherein the first side of the display area is connected to the second side of the display area by the irregular-shaped side; wherein any adjacent two sub-pixels in the column direction or a row direction close to the irregular-shaped side have different light-emitting colors, and
- wherein the irregular-shaped side is an arc.

\* \* \* \* \*